US007307027B1

(12) United States Patent
Ngo et al.

(10) Patent No.: US 7,307,027 B1
(45) Date of Patent: Dec. 11, 2007

(54) VOID FREE INTERLAYER DIELECTRIC

(75) Inventors: Minh Van Ngo, Fremont, CA (US);
Alexander Nickel, Santa Clara, CA (US); Hieu Pham, Milpitas, CA (US);
Jean Yang, Sunnyvale, CA (US);
Hirokazu Tokuno, Cupertino, CA (US);
Weidong Qian, Sunnyvale, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 155 days.

(21) Appl. No.: 11/201,378

(22) Filed: Aug. 11, 2005

(51) Int. Cl.
*H01L 21/31* (2006.01)
(52) U.S. Cl. .............. 438/778; 438/593; 438/257; 438/211; 438/201; 257/E21.679
(58) Field of Classification Search ............. 438/778, 438/593, 257, 211, 201
See application file for complete search history.

(56) References Cited

U.S. PATENT DOCUMENTS

| 6,635,943 B1 * | 10/2003 | Hui et al. ............... 257/506 |
| 2003/0193064 A1 * | 10/2003 | Wu .......................... 257/315 |
| 2006/0001073 A1 * | 1/2006 | Chen et al. ............. 257/314 |

* cited by examiner

*Primary Examiner*—Asok K. Sarkar
*Assistant Examiner*—Victor V. Yevsikov
(74) *Attorney, Agent, or Firm*—Herrity Snyder LLP

(57) ABSTRACT

A method of forming a dielectric between memory cells in a device includes forming multiple memory cells, where a gap is formed between each of the multiple memory cells. The method further includes performing a high density plasma deposition (HDP) process to fill at least a portion of the gap between each of the multiple memory cells with a dielectric material.

11 Claims, 13 Drawing Sheets

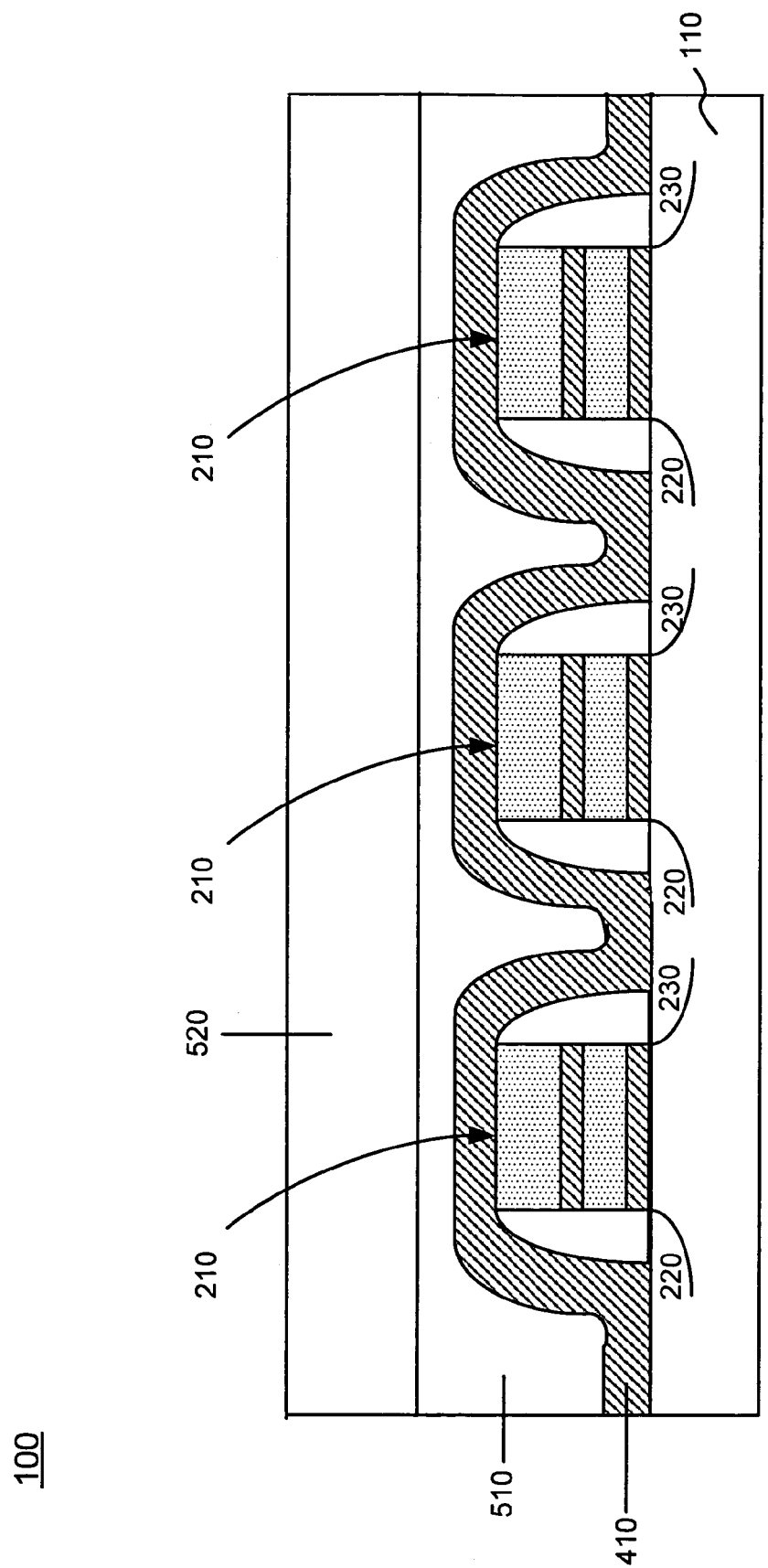

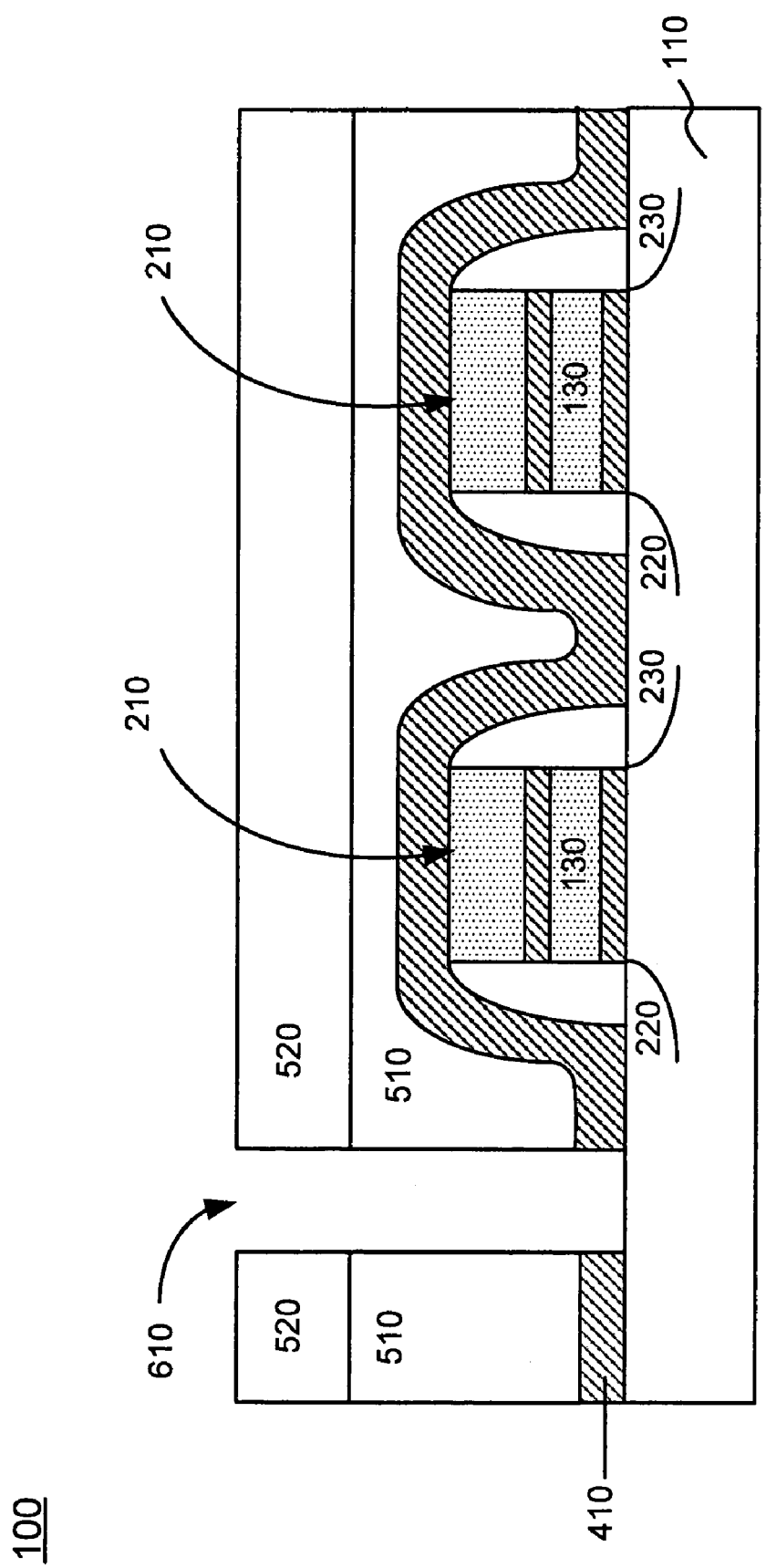

VOID FREE INTERLAYER DIELECTRIC

TECHNICAL FIELD

The present invention relates generally to semiconductor devices and methods of manufacturing semiconductor devices. The invention has particular applicability to forming void fee interlayer dielectrics in semiconductor devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

In addition, various processes that are used to complete the formation of a working memory device, such as an electrically erasable programmable read only memory (EE-PROM) device, often create problems associated with the operation of the memory device. For example, it is often difficult to deposit an interlayer dielectric that fills all the space between adjacent memory cells. This often leads to gaps or voids in the interlayer dielectric. Such gaps or voids in the interlayer dielectric may lead to charge leakage problems associated with memory cells in the memory device. These voids may also make it difficult to program and/or erase the memory device in an efficient manner and, ultimately, may lead to device failure.

DISCLOSURE OF THE INVENTION

According to one aspect consistent with the invention, a method of forming a dielectric between memory cells in a device may include forming multiple memory cells, where a gap is formed between each of the multiple memory cells. The method may further include performing a high density plasma deposition (HDP) process to fill at least a portion of the gap between each of the multiple memory cells with a dielectric material.

According to another aspect consistent with the invention, a method may include forming a first dielectric layer over a substrate and forming a charge storage element over the first dielectric layer. The method may further include forming a second dielectric layer over the charge storage element and forming a control gate over the second dielectric layer. The method may also include forming a third dielectric layer over the control gate and the substrate and depositing a fourth dielectric layer over the third dielectric layer using a high density plasma deposition (HDP) process.

According to a further aspect consistent with the invention, a method of manufacturing a memory device may include forming multiple memory cells and forming a dielectric liner over the multiple memory cells. The method may further include depositing a first dielectric layer over the dielectric liner using a high density plasma (HDP) deposition process, where the first and second dielectric layers comprise an interlayer dielectric.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 5B is a cross-section illustrating the planarization of the dielectric layer of FIG. 5A, and the formation of another dielectric layer to form an interlayer dielectric, in accordance with an embodiment of the invention.

FIGS. 6A and 6B are cross-sections illustrating the formation of a contact in the interlayer dielectric of FIG. 5B in accordance with an embodiment of the invention.

BEST MODE FOR CARRYING OUT THE INVENTION

Implementations consistent with the invention reduce problems in a memory device by forming, using high density plasma (HDP) deposition techniques, a layer that may form at least a portion of an interlayer dielectric. The HDP deposition techniques help reduce or eliminate voids in the interlayer dielectric.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

Figure 1:
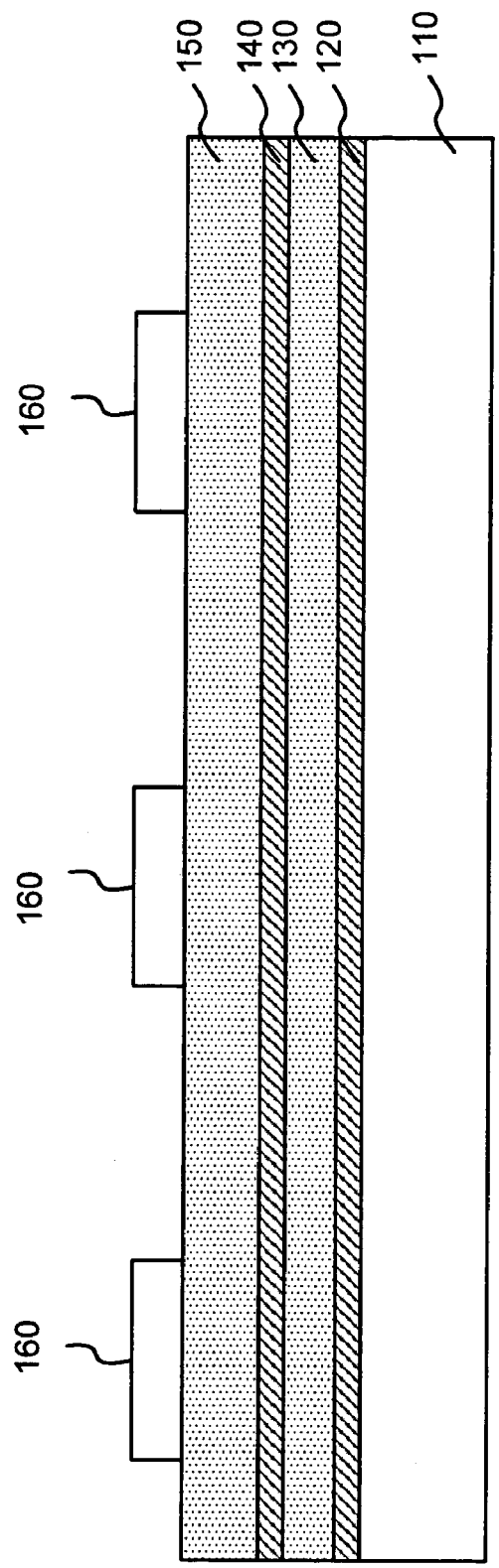
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 10 in a conventional manner. In an exemplary implementation, dielectric layer 120 may include an oxide, such as a silicon oxide (e.g., $SiO_2$), and may have a thickness ranging from about 20 angstroms (Å) to about 120 Å. Dielectric layer 120 may function as a tunnel oxide layer for a subsequently formed memory cell of semiconductor device 100.

Layer 130 may be formed on layer 120 in a conventional manner and may include a conductive material, such as polycrystalline silicon. Layer 130, consistent with the invention, may act as a floating gate layer or charge storage element for semiconductor device 100 and may have a thickness ranging from about 20 Å to about 120 Å. In alternative implementations, layer 130 may include a dielectric material, such as a nitride (e.g., a silicon nitride) or an oxynitride, that acts as a charge storage layer for semiconductor device 100.

Layer 140 may be formed on layer 130 in a conventional manner and may include a dielectric material, such as an oxide (e.g., $SiO_2$). Alternatively, layer 140 may include a material having a high dielectric constant (K), such as aluminum oxide or hafnium oxide, that may be deposited or thermally grown on layer 130. In still other alternatives, layer 140 may be a composite that includes a number of dielectric layers or films, such as an oxide-nitride-oxide stack. Layer 140 may have a thickness ranging from about 20 Å to about 120 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 800 Å to about 2,500 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
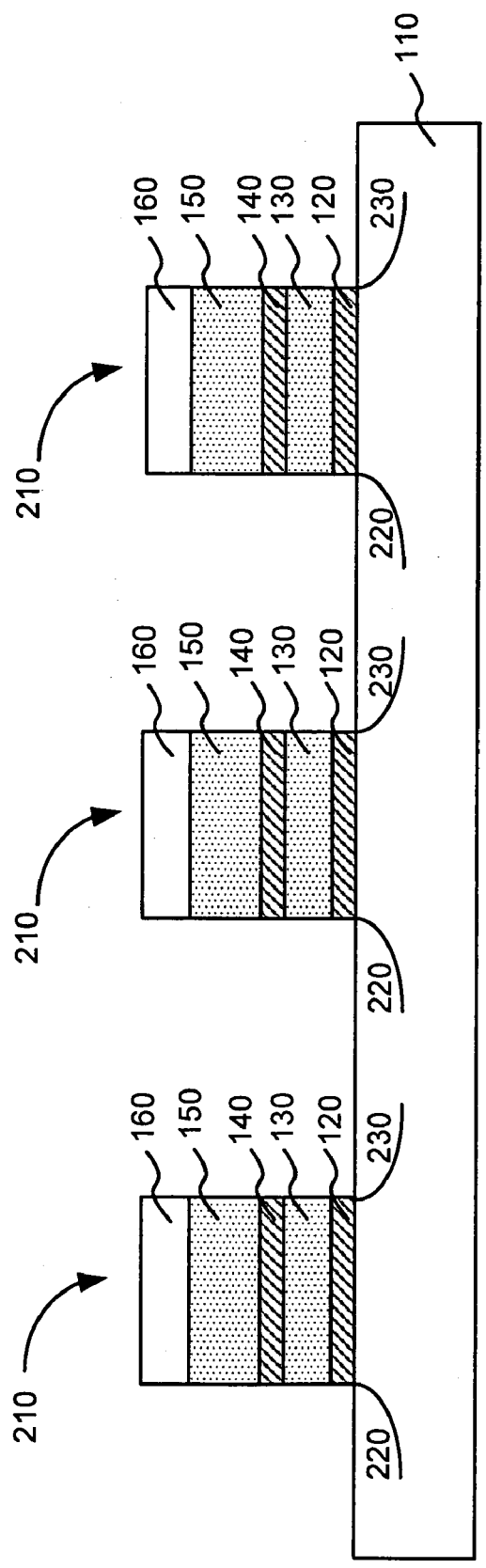
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Alternatively, the etching may terminate at another layer, such as layer 140, followed in some implementations by additional etching, to form structures 210. Each structure 210 (also referred to herein as a memory cell 210) may represent a memory cell of semiconductor device 100, where each memory cell 210 includes a dielectric layer 120, a floating gate or charge storage layer 130, an inter-gate dielectric layer 140 and a control gate 150. Only three memory cells 210 are illustrated in semiconductor device 100 in FIG. 2 for simplicity. It should be understood that semiconductor device 100 may typically include a memory array including a large number of memory cells 210.

Source and drain regions 220 and 230 may be formed in substrate 110, as illustrated in FIG. 2, adjacent each memory cell 210. For example, n-type or p-type impurities may be implanted in substrate 110 to form source and drain regions 220 and 230, based on the particular end device requirements. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
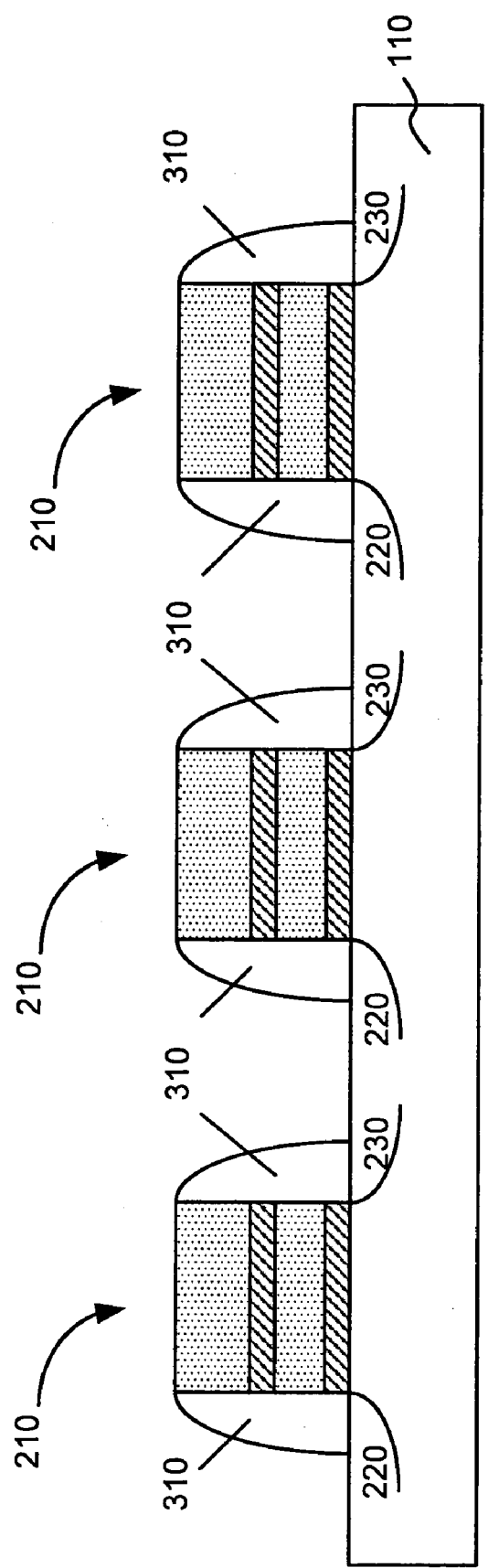
FIG. 3 is a cross-section illustrating the formation of spacers on the memory cells of FIG. 2 in accordance with an embodiment of the invention.

Photoresist masks 160 may be removed using a conventional process and spacers 310 may be formed adjacent the sidewalls of the memory cells 210, as illustrated in FIG. 3. For example, a dielectric material, such as a silicon oxide, a silicon nitride, a silicon oxynitride or another dielectric material, may be deposited and etched to form spacers 310 on each side of memory cells 210, as illustrated in FIG. 3. Spacers 310 may be used to electrically isolate adjacent memory cells 210 from each other. Spacers 310 may also be used to facilitate the deposition of impurities in semiconductor device 100.

Figure 4:
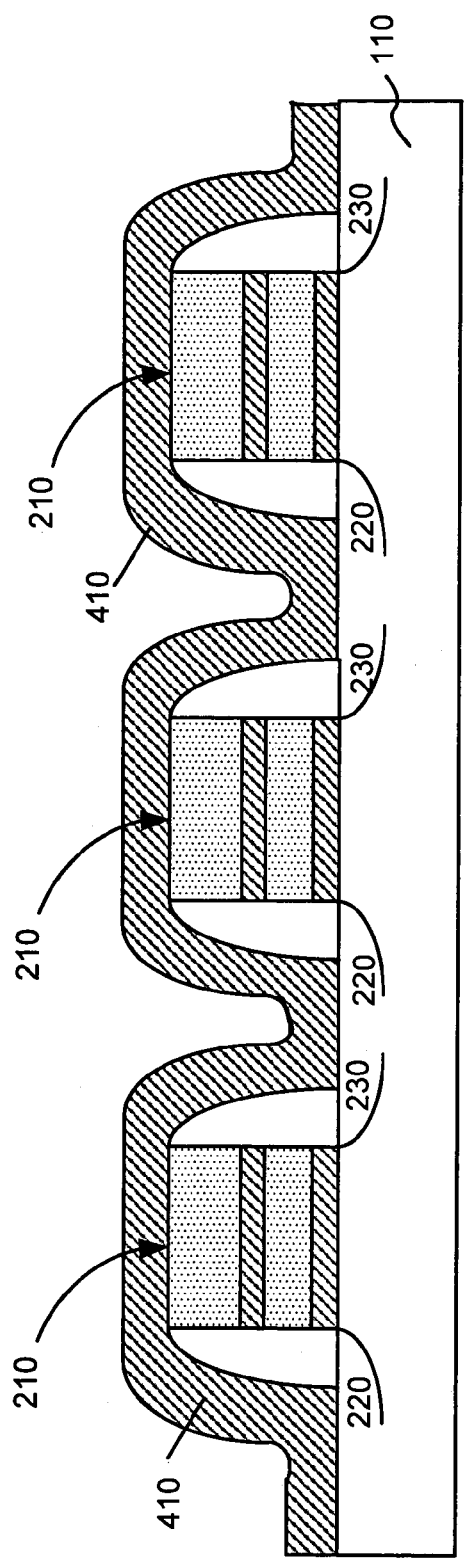
FIG. 4 is a cross-section illustrating the formation of a conformal dielectric layer on the device of FIG. 3 in accordance with an embodiment of the invention.

A liner 410 may then be formed over semiconductor device 100, as illustrated in FIG. 4. In an exemplary embodiment, liner 410 may include a dielectric material, such as, for example, a silicon nitride material (e.g., $Si_3N_4$), a silicon oxynitride (SiON), a silicon oxide (e.g., $SiO_2$) and/or some combination of these materials. Liner 410 may be formed, for example, using existing deposition processes. Liner 410, consistent with the invention, may have a substantially uniform thickness ranging from about 200 Å to about 800 Å over memory cells 210 and substrate 110.

Figure 5A:
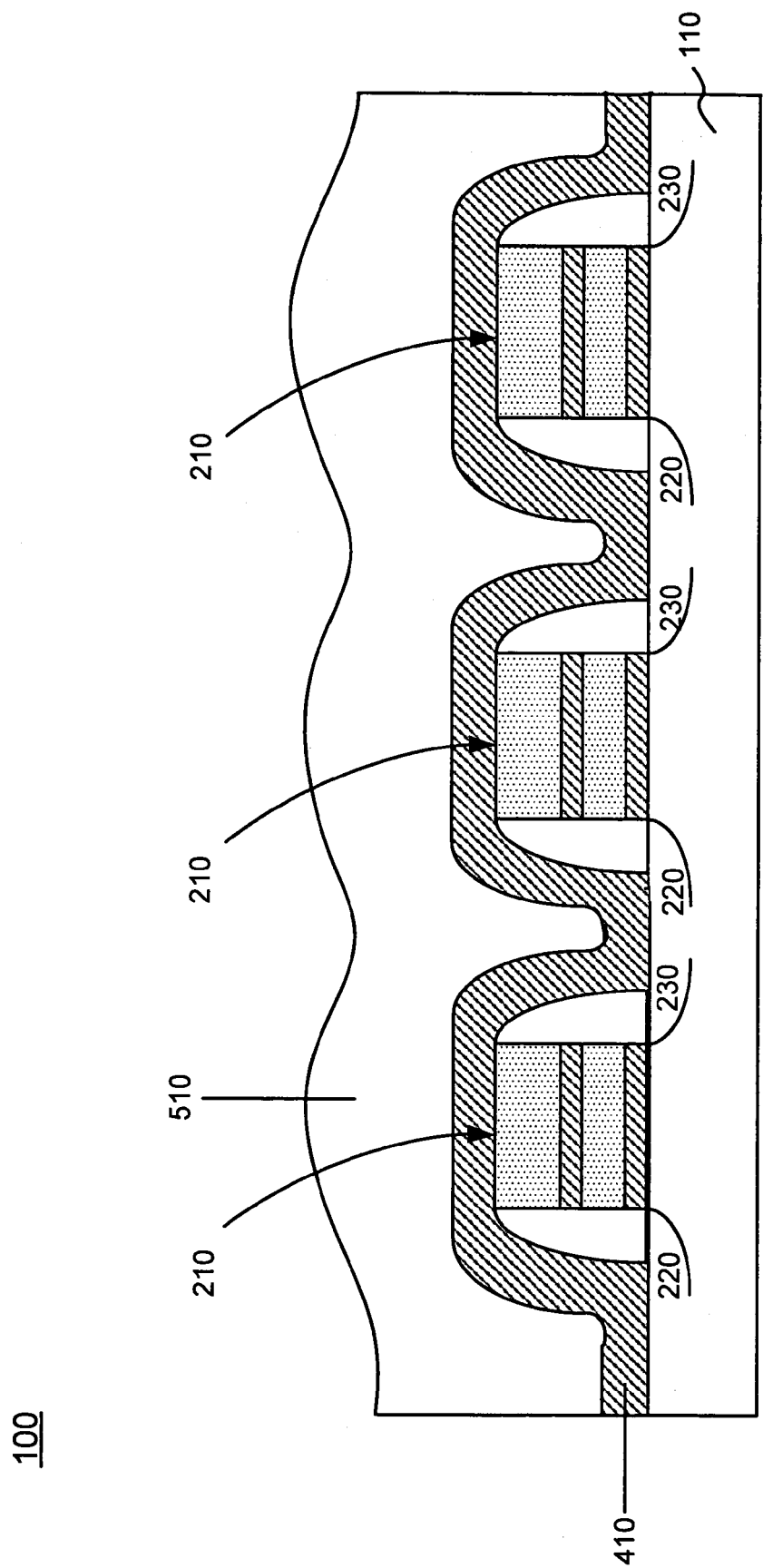
FIG. 5A is a cross-section illustrating the formation of a dielectric layer, using high density plasma (HDP) deposition techniques, on the device of FIG. 4 in accordance with an embodiment of the invention.

A dielectric layer 510 may be formed over liner 410 using a high density plasma (HDP) chemical vapor deposition (CVD) process, as shown in FIG. 5A. Layer 510 may be formed to a thickness ranging from about 3,000 Å to about 12,000 Å. Dielectric layer 510 may include a dielectric material, such as, for example, phosphosilicate glass (PSG), boro-phosphosilicate glass (BPSG), or undoped silicate glass (USG). Typically, HDP-CVD may be carried out in a process chamber, where precursor gases (e.g., silane and oxygen) are flowed into the chamber along with an inert gas (e.g., argon). A plasma may then be formed in a reaction zone proximate to the surface of the substrate by the application of radio frequency (RF) energy. The deposition gases disassociate and react to form a dielectric layer. The flow rates, RF power and other parameters of the HDP-CVD process are typically controlled to produce the desired rate of deposition and etch. The HDP-CVD process advantageously enables layer 510 to fill gaps (i.e., small holes) between memory cells 210, even when memory cells 210 have a high aspect ratio. In this manner, dielectric layer 510 and a subsequently formed dielectric material can form an interlayer dielectric (ILD) that is free of voids, as described in more detail below.

In a HDP process consistent with one implementation, helium (He) and oxygen ($O_2$) may be introduced concurrently with each other into a CVD chamber. In this exemplary implementation, the CVD chamber may be prepared with a pressure in the range of 500 mTorr to about 5 Torr and the CVD chamber may be heated to a temperature ranging from about 250° C. to about 430° C.

After the proper pressure and temperature in the CVD chamber are set, $SiH_4$ may be provided into the CVD chamber at a flow rate ranging from about 10 standard cubic centimeter per minute (sccm) to about 1,000 sccm and $PH_3$ may be provided into the CVD chamber concurrently with the $SiH_4$ at a flow rate ranging from about 10 sccm to about 1,000 sccm. In addition, the radio frequency (RF) power for the CVD chamber may be set to provide power ranging from about 100 watts to about 1,000 watts and a bias voltage ranging from about 0 volts to about 1,000 volts may be applied to semiconductor device 100. The reactants $SiH_4$ and $PH_3$ may be provided for a period ranging from about 1 second to about 1,000 seconds to produce dielectric layer 510 having a thickness ranging from about 3,000 Å to about 12,000 Å. It should be understood that the particular flow rates, pressure range, temperature range, RF power, bias voltage and duration may be adjusted based on the desired thickness of dielectric layer 510. It should also be understood that other reactants, such as $SiH_4$ and $O_2$, or $PH_3$ and $O_2$ may be provided to form dielectric layer 510. In each case, the deposition process may be a HDP deposition process with similar flow rates and other parameters as that described above.

The gap fill properties associated with the HDP deposition process described above generally improves with lower deposition rate (e.g., lower $SiH_4$ flow), or with higher sputtering rate. However, an increase in sputtering rate may lead to plasma damage. The non-plasma produced dielectric liner 410, formed prior to HDP deposition, protects the device(s) from plasma damage.

As further shown in FIG. 5B, layer 510 may be planarized using, for example, a chemical-mechanical polishing (CMP) process. Subsequent to planarization of layer 510, optionally, a second dielectric layer 520 may be formed over layer 510 and then may also be planarized using a conventional process, such as a CMP process. The CMP process may planarize the top surface of layer 520 to facilitate formation of subsequent structures, such as interconnect lines. Layer 520 may include a boro-phosphosilicate glass (BPSG) material. Alternatively, layer 520 may include a phosphosilicate glass (PSG) material, an oxide or some other dielectric material. The thickness of layer 520 may range from about 1,000 Å to about 5,000 Å. Layers 410, 510 and 520, consistent with the invention, may represent an ILD located closest to substrate 110. In alternative implementations, layers 410, 510 and 520 may represent an interlayer dielectric formed a number of layers above the surface of substrate 110. In each case, layers 410, 510 and 520 function as an ILD to isolate various conductive structures, such as various interconnect lines described below or to isolate source region 220 or drain region 230 from other conductive structures. The gap fill properties of HDP layer 510 enables layer 510 to fill substantially all the spaces between adjacent memory cells 210. This eliminates voids in the ILD that includes layers 410, 510 and 520 and prevents subsequent problems associated with voids.

Figure 6B:
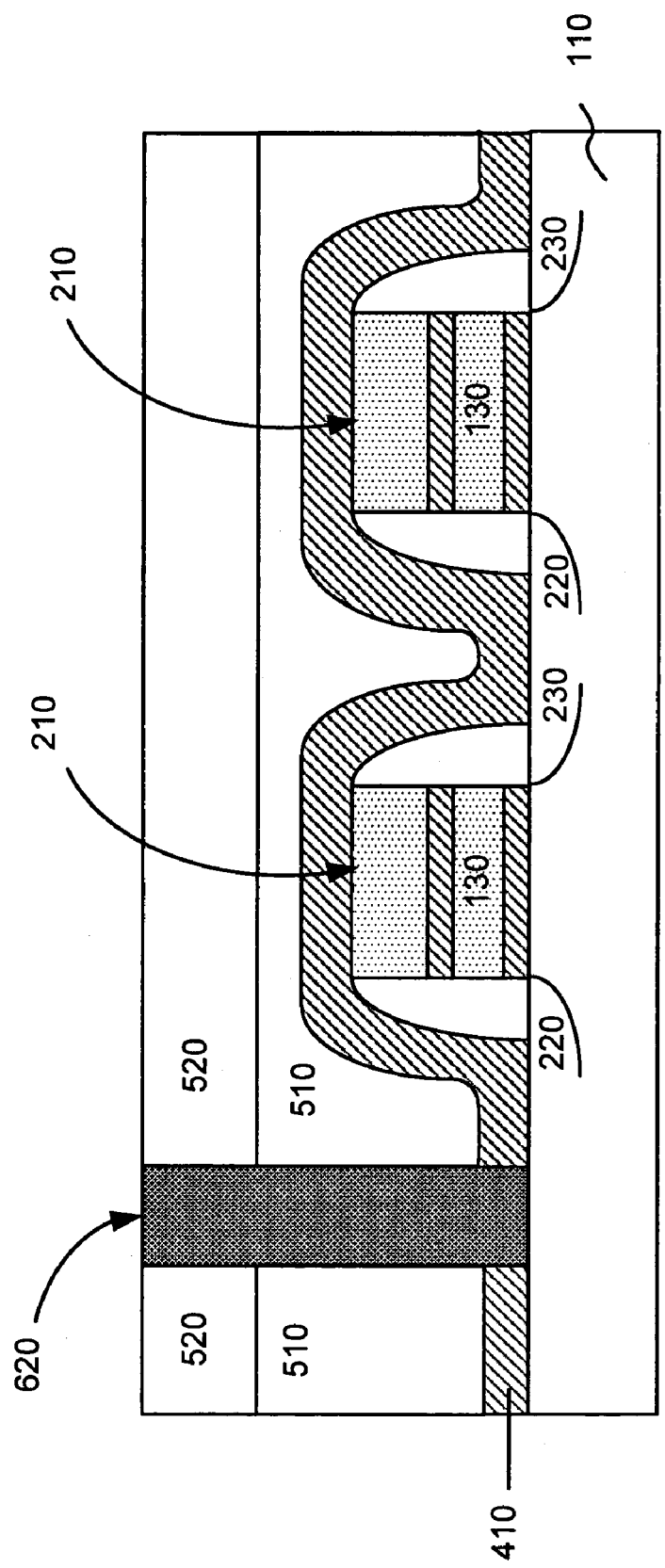

A contact hole 610 may be formed in layers 410 and 510 using conventional photolithographic and etching techniques, as illustrated in FIG. 6A. Contact hole 610 may be used to form a contact to source region 220 or drain region 230. Next, a metal layer 620, such as tungsten, copper or aluminum, may be deposited to fill contact hole 610, as illustrated in FIG. 6B. Metal layer 620 may represent a contact to, for example, a source region 220.

Figure 7:
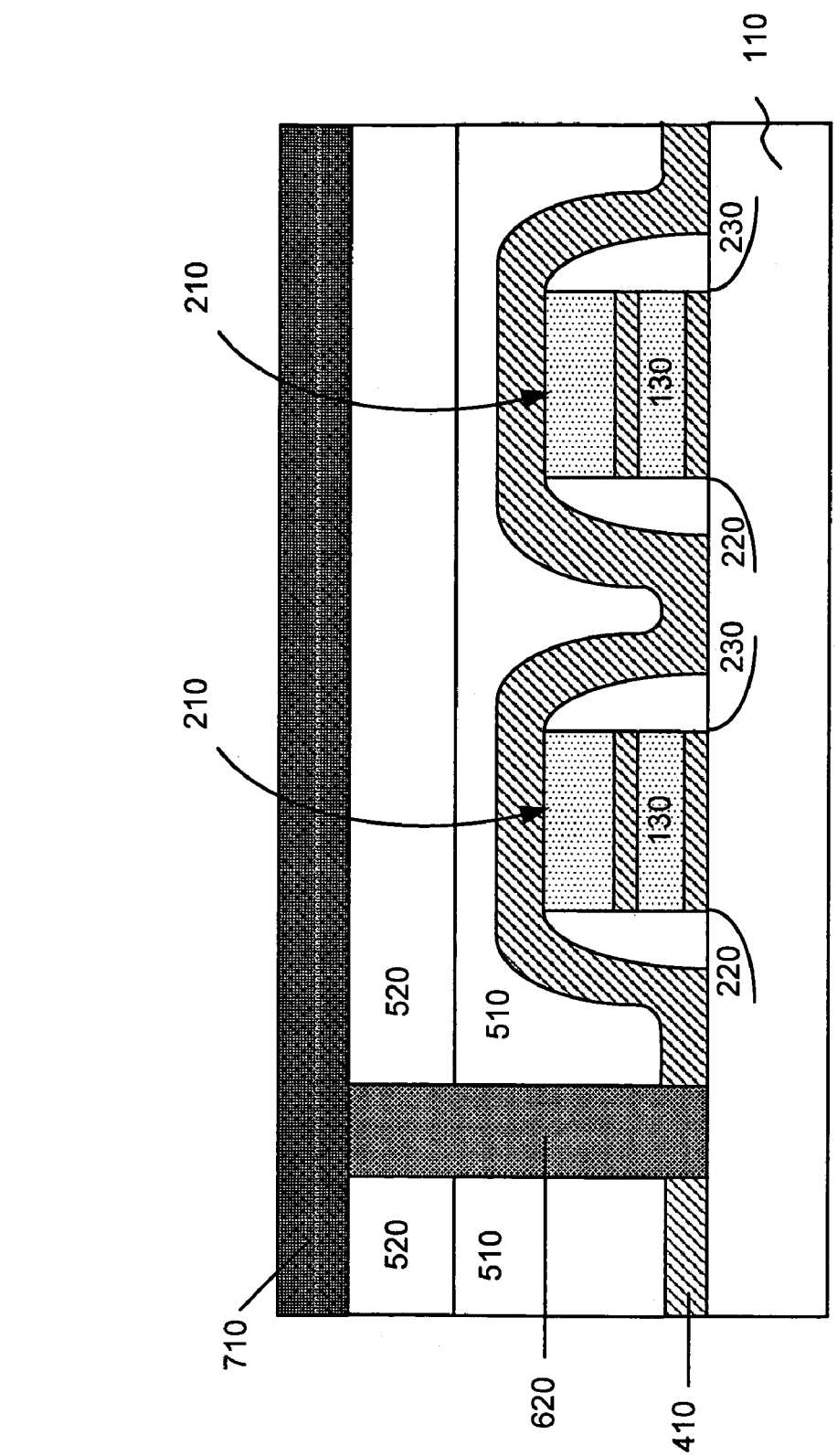
FIG. 7 is a cross-section illustrating the formation of a conductive interconnect on the device of FIG. 6B in accordance with an embodiment of the invention.

A conductive interconnect line 710 may then be formed over the planarized top surface of layer 520, as illustrated in FIG. 7. For example, a metal, such as tungsten, copper or aluminum, may be deposited to form conductive line 710 that connects various features in semiconductor device 100, such as source or drain regions 220/230 through contact 620 to an external electrode (not shown). Alternatively, conductive line 710 may connect various memory cells 210 in semiconductor device 100. Conductive line 710 may facilitate programming or erasing various memory cells 210 in semiconductor device 100.

Figure 8:
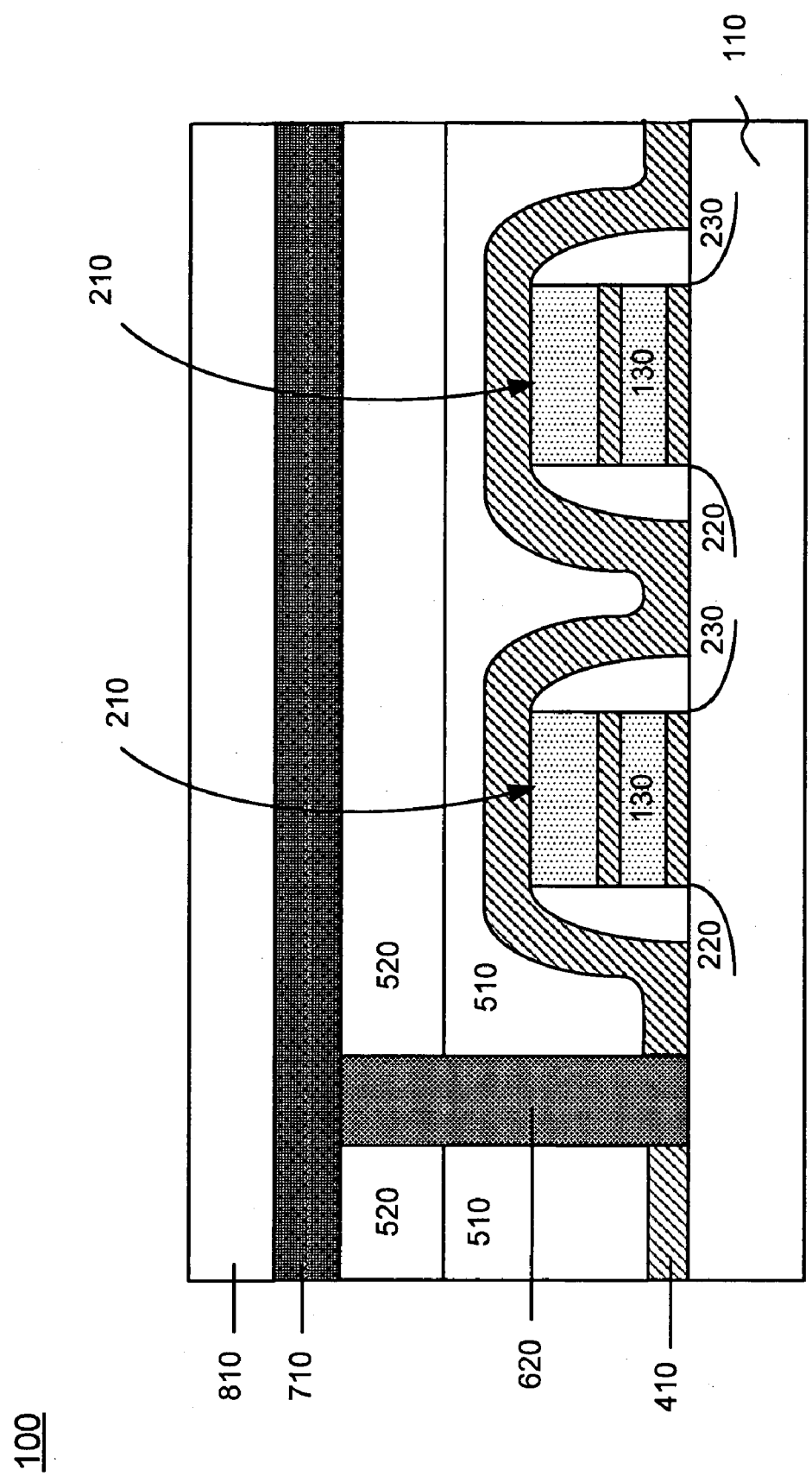
FIG. 8 is a cross-section illustrating the formation of an interlayer layer dielectric on the device of FIG. 7 in accordance with an embodiment of the invention.

An ILD 810 may be formed over conductive line 710, as illustrated in FIG. 8. In an exemplary implementation, ILD 810 may include a PSG material, a fluorine doped silicate glass (FSG) material, an oxide, a nitride or some other dielectric material. The thickness of ILD 810 may range from about 1,500 Å to about 3,500 Å. In some implementations, an ILD liner may be formed prior to the formation of ILD 810.

Figure 9:
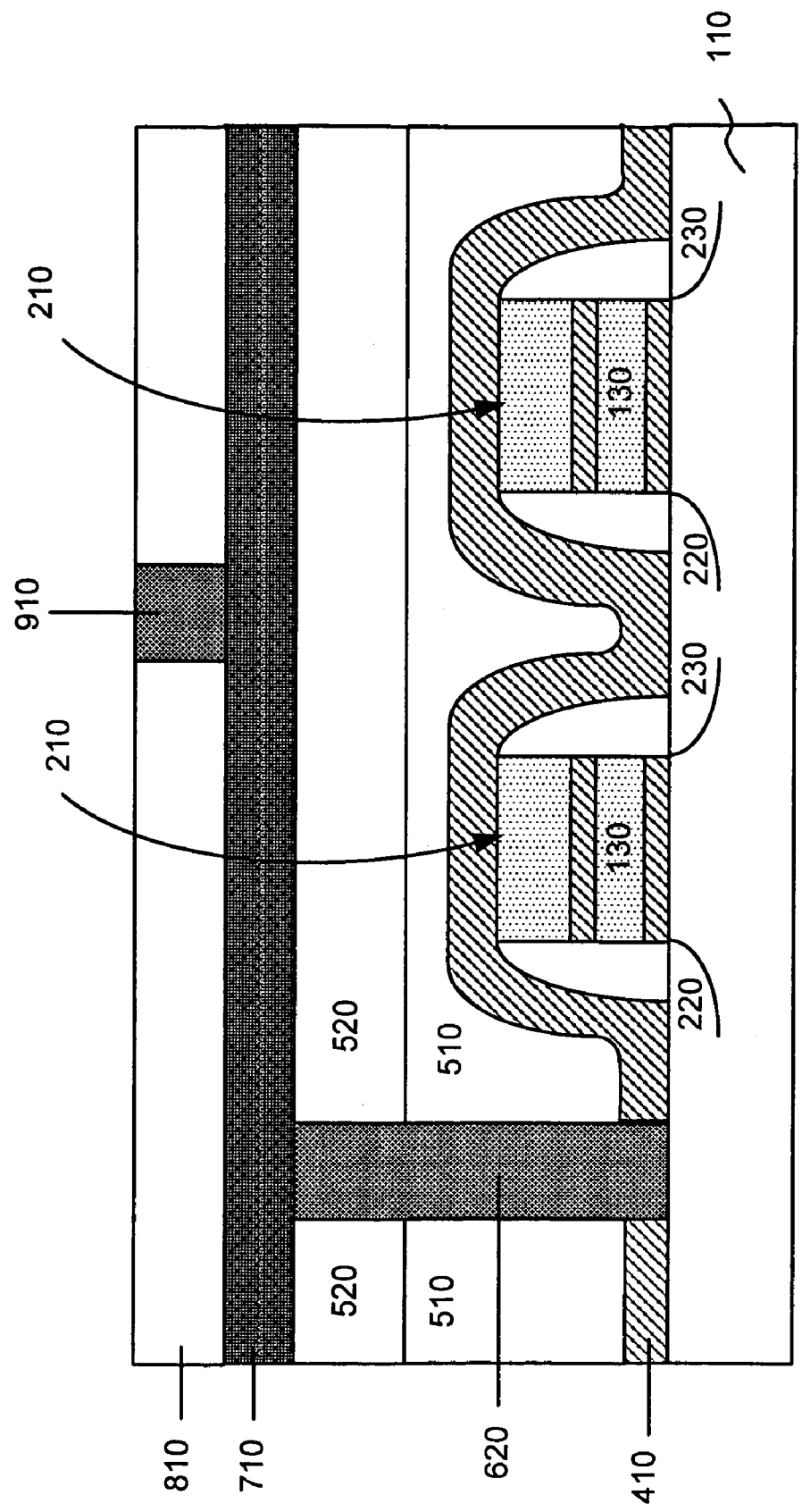
FIG. 9 is a cross-section illustrating the formation of a contact in the interlayer dielectric of FIG. 8 in accordance with an embodiment of the invention.

Various back end of line (BEOL) processing may be performed to complete the fabrication of semiconductor device 100. For example, a contact hole/trench may be formed in ILD 810 followed by deposition of a metal layer 910, such as tungsten, copper or aluminum, as illustrated in FIG. 9. Metal layer 910 may represent a contact to an uppermost conductive layer of semiconductor device 100. Alternatively, metal layer 910 may represent a contact to any one of a number of conductive layers in semiconductor device 100.

Figure 10:
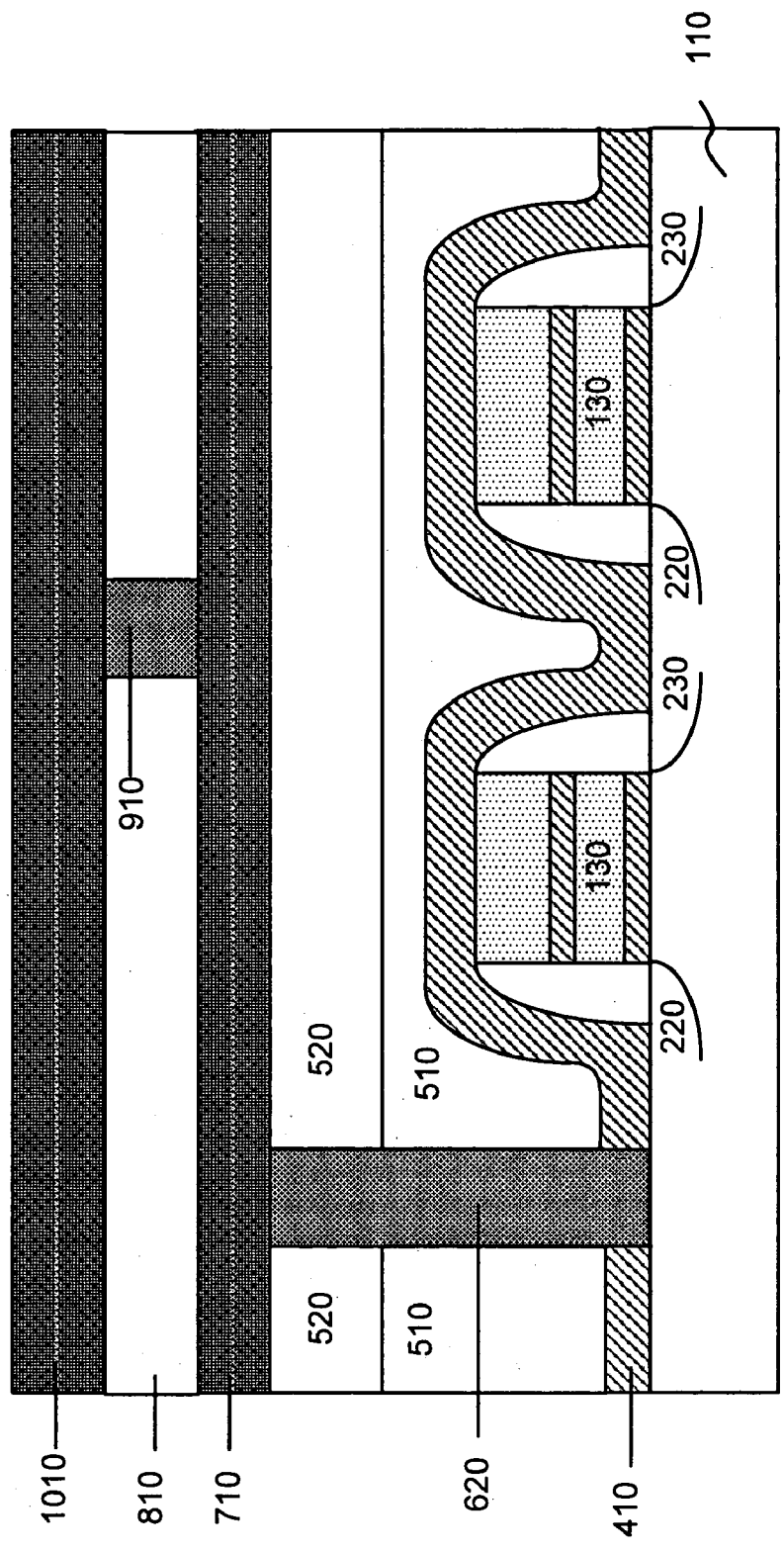
FIG. 10 is a cross-section illustrating the formation of a conductive layer on the device of FIG. 9 in accordance with an embodiment of the invention.

A conductive layer may then be formed over ILD 810. For example, a metal, such as tungsten, copper or aluminum, may be deposited to form conductive line 1010, as illustrated in FIG. 10. Conductive line 1010 may represent a BEOL structure or connector that connects various features in semiconductor device 100, such as source or drain regions 220/230 to an external electrode (not shown), to facilitate programming or erasing of various memory cells 210 in semiconductor device 100.

Figure 11:
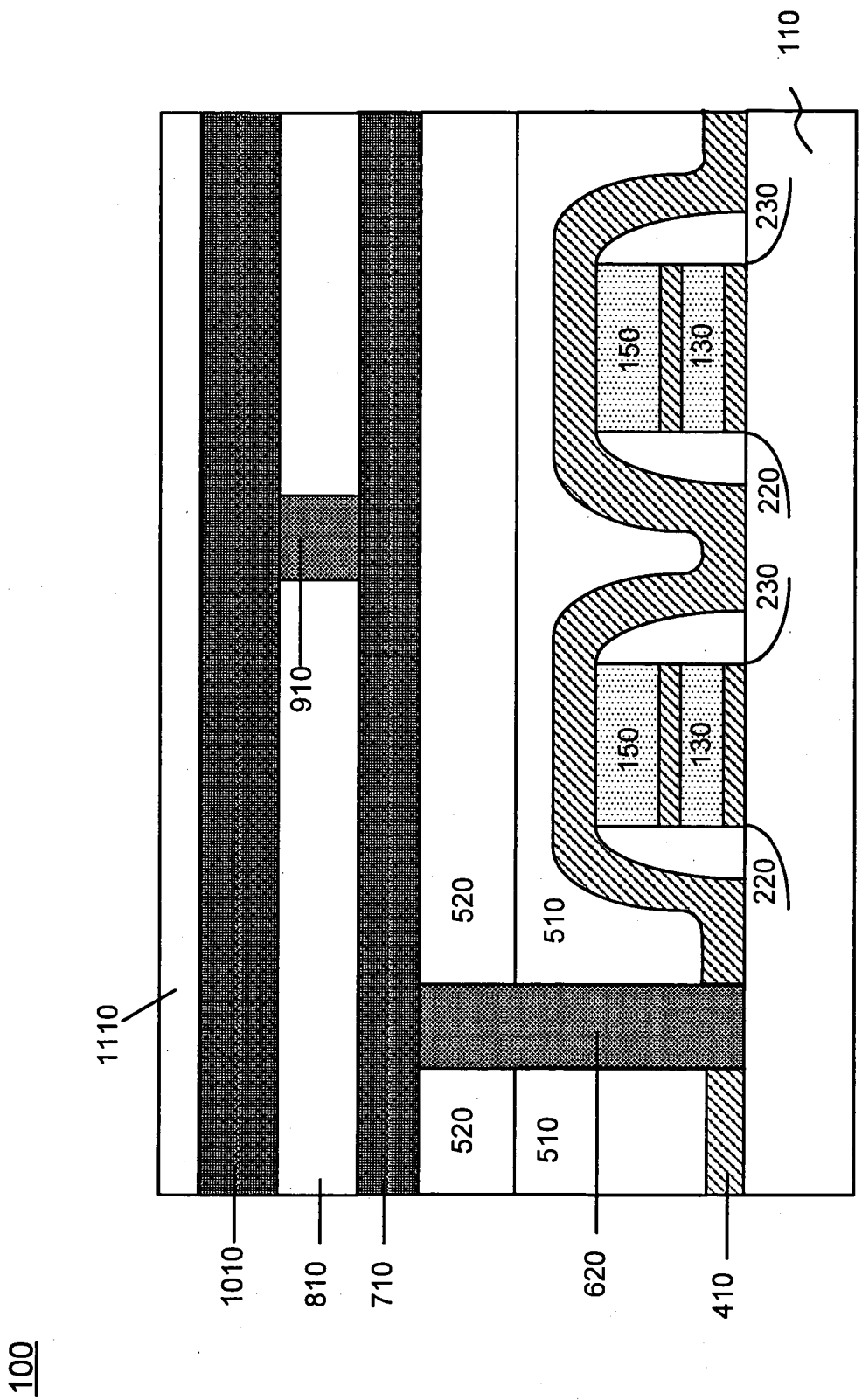
FIG. 11 is a cross-section illustrating the formation of a dielectric layer on the device of FIG. 10 in accordance with an embodiment of the invention.

A top dielectric layer 1110, also referred to as cap layer 1110, may be formed over conductive line 1010, as shown in FIG. 11. In an exemplary embodiment, cap layer 1110 may be deposited to a thickness ranging from about 6,000 Å to about 10,000 Å. Cap layer 1110 may act as a protective layer to prevent damage to conductive line 1010 and other portions of semiconductor device 100 during subsequent processing. For example, cap layer 1110 may protect semiconductor device 100 against impurity contamination during subsequent cleaning processes that may be used to complete a working memory device.

While only three ILDs (i.e., layers 410/510/520 and ILD 810) and two conductive layers (i.e., layers 710 and 1010) are illustrated in FIG. 11 for simplicity, it should be understood that semiconductor device 100 may include more ILD layers and conductive layers based on the particular circuit requirements.

Each memory cell 210 in semiconductor device 100 may be an EEPROM type memory device and one or more programming circuits (not shown) may be used to facilitate programming and erasing of one or more memory cells 210 of semiconductor device 100. Programming of memory cells 210 may be accomplished by applying a predetermined voltage to control gate 150. Once programmed, electrons remain stored in layer 130 until an erase procedure is performed.

As described above with respect to FIG. 1, in an exemplary embodiment consistent with the invention, semiconductor device 100 may be a floating gate memory device in which layer 130 may include a conductive material, such as polycrystalline silicon. In another exemplary embodiment described above with respect to FIG. 1, layer 130 may include a dielectric material, such as a silicon nitride. In this embodiment, semiconductor device 100 illustrated in FIG. 11 may be a SONOS type memory device with a silicon control gate 150 formed on an oxide-nitride-oxide (ONO) stack (layers 140, 130, 120), with nitride layer 130 acting as the charge storage layer, and the ONO stack being formed on a silicon substrate 110.

Further, in an exemplary implementation in which semiconductor device is a SONOS type memory device, each of memory cells 210 illustrated in FIG. 11 may be configured to store two bits of data. That is, charge storage layer 130 may be programmed to store charges representing two separate bits of data by localizing the first and second charges to the respective left and right sides of charge storage layer 130 illustrated in FIG. 11. Each of the two bits of memory cell 210 may be programmed independently by, for example, channel hot electron injection, to store charges representing a bit on each respective side of the charge storage layer 130. In this manner, the charges in charge storage layer 130 become effectively trapped on each respective side of charge storage layer 130. Erasing of each bit in memory cell 210 may also be performed independently. During erasing, the charges stored in charge storage layer 130 may tunnel through dielectric layer 120 into source region 220 and drain region 230, respectively. In this implementation, the density of the array of memory cells 210 in semiconductor device 100 may be increased as compared to conventional memory devices that store only one bit of data per cell. In still other alternatives, charge storage layer 130 may be configured to store three or more bits of data for each memory cell 210.

In summary, implementations consistent with the invention form an ILD that includes a dielectric layer 510 formed using HDP deposition techniques. Layer 510, together with previously and subsequently formed dielectric layers (i.e., layers 410 and 520), form an ILD. Advantageously, the ILD may be formed without voids or gaps. Memory cells 210 may therefore exhibit increased reliability and may be efficiently programmed and/or erased.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, an ILD has been described as being formed with a liner layer 410 and layers 510 and 520 formed over layer 410. In alternative implementations, one or both of layers 410 and 520 may not be used. In such implementations, all of the ILD, or substantially all of the ILD, may be formed using an HDP process. Additionally, the dielectric and conductive layers used in manufacturing a semiconductor device in accordance with the invention can be deposited by conventional deposition techniques. For example, various types of CVD processes, including PECVD and low pressure chemical vapor deposition (LPCVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a dielectric between memory cells in a device, comprising:
    forming a plurality of memory cells, wherein a gap is formed between each of the plurality of memory cells;
    performing a high density plasma deposition (HDP) process to fill at least a portion of the gap between each of the plurality of memory cells with a dielectric material that is substantially free of voids,
    wherein the HDP process comprises providing $SiH_4$ at a flow rate ranging from about 10 standard cubic centimeters per minute to about 1,000 standard cubic centimeters per minute, and providing $PH_3$ at a flow rate ranging from about 10 standard cubic centimeters per minute to about 1,000 standard cubic centimeters per minute, for a period ranging from about 1 second to about 1,000 seconds;
    forming a liner layer over the plurality of memory cells prior to performing the HDP process, wherein the liner layer comprises at least one of silicon nitride or silicon oxynitride; and
    planarizing the dielectric material.

2. The method of claim 1, wherein the dielectric material comprises at least a portion of an interlayer dielectric.

3. The method of claim 1, further comprising:
    using the HDP deposition process to form the dielectric material to a thickness ranging from about 3,000 Å to about 12,000 Å.

4. A method, comprising:
    forming a first dielectric layer over a substrate;
    forming a charge storage element over the first dielectric layer;
    forming a second dielectric layer over the charge storage element;
    forming a control gate over the second dielectric layer;
    forming a third dielectric layer over the control gate and the substrate, wherein the third dielectric layer comprises a silicon nitride or a silicon oxynitride layer;
    etching the first dielectric layer, charge storage element, second dielectric layer and control gate to form two memory cells prior to forming the third dielectric layer; and
    depositing a fourth dielectric layer over the third dielectric layer using a high density plasma deposition (HDP) process to fill a gap between the two memory cells, wherein the fourth dielectric layer comprises borophosphosilicate glass (BPSG) or undoped silicate glass (USG), wherein the fourth dielectric layer is substantially void free and wherein depositing the fourth dielectric layer using a HDP process comprises:

providing $SiH_4$ and $PH_3$ to a chemical vapor deposition chamber, each at a flow rate of at least 10 standard cubic centimeters per minute.

5. The method of claim 4, wherein the third dielectric layer has a thickness ranging from about 200 Å to about 800 Å.

6. The method of claim 5, wherein the fourth dielectric layer has a thickness ranging from about 3,000 Å to about 12,000 Å.

7. The method of claim 4, wherein the third dielectric layer has a substantially uniform thickness that acts as a liner for the fourth dielectric layer.

8. A method of manufacturing a memory device, comprising:

forming a plurality of memory cells;

forming a dielectric liner over the plurality of memory cells, wherein the dielectric liner comprises silicon oxynitride or silicon nitride; and depositing a first dielectric layer over the dielectric liner using a high density plasma (HDP) deposition process to fill gaps between the plurality of memory cells, wherein the first dielectric layer is substantially void free, wherein the dielectric liner and first dielectric layer comprise an interlayer dielectric, wherein the first dielectric layer comprises boro-phosphosilicate glass (BPSG) or undoped silicate glass (USG) and wherein depositing the first dielectric layer using a HDP process comprises:

providing $SiH_4$ and $PH_3$ to a chemical vapor deposition chamber, each at a flow rate of at least 10 standard cubic centimeters per minute.

9. The method of claim 8, wherein the dielectric liner is formed to a thickness ranging from about 200 Å to about 800 Å.

10. The method of claim 9, wherein the first dielectric layer is deposited to a thickness ranging from about 3,000 Å to about 12,000 Å.

11. The method of claim 9, wherein depositing the first dielectric layer using a HDP deposition process further comprises:

providing the $SiH_4$ at a flow rate ranging from about 10 standard cubic centimeters per minute to about 1,000 standard cubic centimeters per minute, and providing the $PH_3$ at a flow rate ranging from about 10 standard cubic centimeters per minute to about 1,000 standard cubic centimeters per minute, for a period ranging from about 1 second to about 1,000 seconds.

* * * * *